United States Patent
Cohen et al.

(10) Patent No.: US 10,746,771 B2
(45) Date of Patent: Aug. 18, 2020

(54) METHOD OF DETERMINING LINEAL PARAMETERS OF A TRANSMISSION LINE

(71) Applicant: COMMISSARIAT A L'ENERGIE ATOMIQUE ET AUX ENERGIES ALTERNATIVES, Paris (FR)

(72) Inventors: Josy Cohen, Le Plessis Trevise (FR); Nicolas Gregis, Fresnes (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 451 days.

(21) Appl. No.: 15/505,044

(22) PCT Filed: Aug. 24, 2015

(86) PCT No.: PCT/EP2015/069323
§ 371 (c)(1),
(2) Date: Feb. 17, 2017

(87) PCT Pub. No.: WO2016/030314
PCT Pub. Date: Mar. 3, 2016

(65) Prior Publication Data
US 2017/0269137 A1  Sep. 21, 2017

(30) Foreign Application Priority Data
Aug. 26, 2014  (FR) ..................... 14 57980

(51) Int. Cl.
*G01R 27/32* (2006.01)
*G06F 17/18* (2006.01)

(52) U.S. Cl.
CPC ............. *G01R 27/32* (2013.01); *G06F 17/18* (2013.01)

(58) Field of Classification Search
CPC ..................................................... G01R 27/32
See application file for complete search history.

(56) References Cited

U.S. PATENT DOCUMENTS

| 5,502,392 A | 3/1996 | Arjavalingam et al. |
| 2005/0238037 A1* | 10/2005 | Dodds ..................... H04L 43/50 370/420 |

(Continued)

FOREIGN PATENT DOCUMENTS

WO  2014/065674 A1  5/2014

OTHER PUBLICATIONS

Qinghai Shi et al., "Analysis of the parameters of a lossy coaxial cable for cable fault location," 8th International Multi-Conference on Systems, Signals & Devices, 2011 IEEE.

(Continued)

*Primary Examiner* — Manuel A Rivera Vargas
(74) *Attorney, Agent, or Firm* — Baker & Hostetler LLP

(57) ABSTRACT

A method for determining at least one lineal parameter of a transmission line comprises the following steps: determining at least one measurement of the complex propagation factor γ as a function of frequency on the basis of at least one measurement carried out on the transmission line, determining at least one measurement of the lineal attenuation α of the transmission line equal to the real part of the measurement of the complex propagation factor γ and/or at least one measurement of the phase factor β of the transmission line equal to the imaginary part of the measurement of the complex propagation factor γ, filtering the measurement of the lineal attenuation α and/or the measurement of the phase factor β on the basis of a polynomial frequency regression model dependent on the physical characteristics of the transmission line.

21 Claims, 2 Drawing Sheets

(56) References Cited

U.S. PATENT DOCUMENTS

2011/0071776 A1    3/2011    Andle et al.
2016/0139194 A1    5/2016    Cohen et al.

OTHER PUBLICATIONS

Florent Loete et al., "Inverse Scattering Experiments for Electric Cable Soft Fault Diagnosis and Connector Location," pp. 1-5.
William Eisenstadt et al., "S-Parameter-Based IC Interconnect Transmission Line Characterization," IEEE Transactions on Components, Hybrids, and Manufacturing Technology, vol. 15, No. 4, Aug. 1992, pp. 483-490.
Scott Huss, "A Mathematical and Lumped-Element Model for Multiple Cascaded Lossy transmission Lines with Arbitrary impedances and discontinuities," 1995 IEEE, pp. 1844-1847.
Qinghai Shi et al., "System simulation of network analysis for a lossy cable system," 9th International Multi-Conference on Systems, Signals and Devices, 2012 IEEE.
R. Papazyan et al., Extraction of high frequency power cable characteristics from S-parameter measurements, IEEE Transactions on Dielectrics and Electrical Insulation, vol. 11, No. 3, Jun. 2004, pp. 461-470.
Dounavis et al., "Passive Closed-Form Transmission Line Macromodel Using Method of Characteristics," IEEE Transactions on Advanced Packaging, vol. 31, No. 1, Feb. 1, 2008, pp. 190-202, XP011346175.
"Spectrum management for loop transmission systems," American National Standards Institute, Inc., 1999, XP002178517.
Wielen, "On-line detection and location of partial discharges in medium-voltage power cables", pp. 44-112, Jan. 2005.

* cited by examiner

METHOD OF DETERMINING LINEAL PARAMETERS OF A TRANSMISSION LINE

CROSS-REFERENCE TO RELATED APPLICATIONS

This application is a National Stage of International patent application PCT/EP2015/069323, filed on Aug. 24, 2015, which claims priority to foreign French patent application No. FR 1457980, filed on Aug. 26, 2014, the disclosures of which are incorporated by reference in their entirety.

FIELD OF THE INVENTION

The present invention relates to the field of systems and methods for cable diagnosis and in particular the field of reflectometry procedures making it possible to detect and/or locate faults impacting a cable.

The invention pertains more precisely to a method making it possible to determine the lineal parameters of a transmission line such as lineal resistance, lineal inductance, lineal capacitance and lineal conductance.

BACKGROUND

Such parameters are important in characterizing a cable and can be useful within the framework of wired diagnosis based on a reflectometry procedure.

In particular the lineal parameters determined by virtue of the present invention can be used as the input data of the reflectometry method described in the applicant's French patent application filed under the number FR 1355377.

But they can also be used for other applications which require a knowledge of these parameters, for example they can be employed to simulate a complex network of cables to allow the diagnosis of faults on the basis of this simulated environment.

The invention applies to any type of electrical cable, in particular energy transmission cables or communication cables, in fixed or mobile installations. The cables concerned can be coaxial, bifilar, in the form of parallel lines, twisted pairs, stranded cable or other. The invention can also apply to mechanical cables, for example cables for supporting infrastructures such as an elevator or a bridge.

The lineal parameters of a transmission line are not always known or provided in the cable manufacturer's documentation. Furthermore, the data provided by cable makers do not always enable these parameters to be determined with sufficient precision.

The procedures described in the publications [1], [2] and [3] are moreover known. These procedures present the following limitations. They usually require at least two measurement points on the cable under test, for example a measurement point at the input and a measurement point at the output or two measurement points at the input while modifying, between the two measurements, the load at the input. Furthermore these procedures present the drawback of being sensitive to electrical faults which disturb the measurements of the lineal parameters obtained.

On the basis of a measurement by time-domain or frequency-domain reflectometry, the present invention makes it possible to extract, by a calculation facility, the cable's intrinsic and generic lineal parameters representative of the propagation of an electromagnetic signal within said cable, over a sought-after frequency span which may be wider than the frequency band of the probe signal.

The lineal parameters of a cable are the lineal resistance R, the lineal inductance L, the lineal capacitance C and the lineal conductance G. In the subsequent description these parameters will be designated by the term RLCG parameters.

SUMMARY OF THE INVENTION

The subject of the invention is a method for determining at least one lineal parameter of a transmission line, said method comprising the following steps:

determining at least one measurement of the complex propagation factor $\gamma$ as a function of frequency on the basis of at least one measurement carried out on the transmission line, determining at least one measurement of the lineal attenuation $\alpha$ of the transmission line equal to the real part of the measurement of the complex propagation factor $\gamma$ and/or at least one measurement of the phase factor $\beta$ of the transmission line equal to the imaginary part of the measurement of the complex propagation factor $\gamma$, filtering the measurement of the lineal attenuation $\alpha$ and/or the measurement of the phase factor $\beta$ on the basis of a polynomial frequency regression model dependent on the physical characteristics of the transmission line.

According to a particular aspect of the invention, the regression model for the lineal attenuation is of the type $\alpha(f)=a_0\sqrt{f}+a_1 f$, where $a_0$ and $a_1$ are two real numbers.

According to a particular aspect of the invention, the regression model for the phase factor is of the type $\beta(f)=b_0 f$ where $b_0$ is a real number.

According to a particular aspect, the method according to the invention furthermore comprises the determination of an estimate of at least one lineal parameter of the transmission line from among the lineal resistance, the lineal inductance, the lineal capacitance or the lineal conductance, on the basis of at least one measurement from among the filtered measurement of the lineal attenuation, the filtered measurement of the phase factor and the measurement of the reflection coefficient $\rho_e$ at a first end of the transmission line, said estimate being determined as a polynomial function of frequency.

According to a particular aspect, the method according to the invention furthermore comprises the following steps:

determining a new estimate $X_i$ of a characteristic parameter of the propagation in the transmission line on the basis of said estimate of at least one lineal parameter of the transmission line, measuring the degree of similarity between the new estimate $X_{ii}$ and a measurement X of the same characteristic parameter.

According to a particular aspect of the invention, the characteristic parameter of the propagation in the transmission line is the complex propagation factor $\gamma$ or a function of this parameter.

According to a particular aspect of the invention, the measurement of the complex propagation factor $\gamma$ is determined with the aid of the following steps:

determining a measurement H of the frequency transfer function of the transmission line, determining a measurement of the reflection coefficient $\rho_e$ at a first end of the transmission line, determining a measurement of the complex propagation factor $\gamma$ on the basis of the measurement H of the frequency transfer function, of the measurement of the reflection coefficient $\rho_e$ at a first end of the transmission line and of an estimate of the length of the transmission line.

According to a particular aspect of the invention, the measurement H of the frequency transfer function of the transmission line is determined with the aid of a frequency-domain reflectometry procedure based on injecting, at a first end of the line, a reflectometry signal.

According to a particular aspect of the invention, the measurement of the reflection coefficient $\rho_e$ at the input of the transmission line is determined by an average, over a given frequency band, of the measurement H of the frequency transfer function of the transmission line.

According to a particular aspect of the invention, the measurement H of the frequency transfer function of the transmission line is determined with the aid of a time-domain reflectometry procedure based on injecting, at a first end of the line, a reflectometry signal.

According to a particular aspect of the invention, the measurement of the reflection coefficient $\rho_e$ at the input of the transmission line is determined by measuring the amplitude of the spike of the reflected reflectometry signal at the injection point.

According to a particular aspect, the method according to the invention furthermore comprises the following steps:
determining a measurement of the characteristic impedance $Z_c$ of the transmission line or a measurement of the reflection coefficient at a second end of the transmission line on the basis of the measurement of the reflection coefficient $\rho_e$ at a first end of the transmission line,
determining a measurement of the complex propagation factor $\gamma$ on the basis of the measurement H of the frequency transfer function and of the measurement of the characteristic impedance $Z_c$ of the transmission line or of the measurement of the reflection coefficient at a second end of the transmission line.

According to a particular aspect of the invention, the characteristic parameter of the propagation in the transmission line is the frequency transfer function H or the characteristic impedance $Z_c$ or a function of one of its parameters.

According to a particular aspect of the invention, the degree of similarity is measured by calculating a coefficient of determination between the new estimate of a characteristic parameter $X_i$ of the propagation in the transmission line and the measurement X of the same characteristic parameter.

According to a particular aspect, the method according to the invention furthermore comprises the following steps:
determining a new estimate $\gamma_i$ of the complex propagation factor of the transmission line on the basis of the estimates of the lineal resistance, of the lineal inductance, of the lineal capacitance and of the lineal conductance of the transmission line,
executing the steps of the method making it possible to determine an estimate of at least one lineal parameter of the transmission line on the basis of the new estimate $\gamma_i$ of the complex propagation factor.

According to a particular aspect of the invention, the steps of the method are iterated a given number of times and the lineal parameters retained are those determined at the iteration corresponding to the highest degree of similarity.

According to a particular aspect of the invention, the steps of the method are iterated as long as the degree of similarity has not attained a given value.

According to a particular aspect of the invention, the transmission line is a coaxial cable or a bifilar cable or a twisted cable.

According to a particular aspect, the method according to the invention furthermore comprises a frequency decimation step applied to a plurality of measurements of the lineal attenuation $\alpha$ and/or of measurements of the phase factor $\beta$ before the filtering step.

The subject of the invention is also a computer program comprising instructions for the execution of the method for determining at least one lineal parameter of a transmission line according to the invention, when the program is executed by a processor, and a device comprising first measurement means connected to a transmission line and second calculation means configured to execute the method for determining at least one lineal parameter of a transmission line according to the invention.

BRIEF DESCRIPTION OF THE DRAWINGS

Other characteristics and advantages of the present invention will become better apparent on reading the description which follows in relation to the appended drawings which represent.

DETAILED DESCRIPTION

Figure 1:
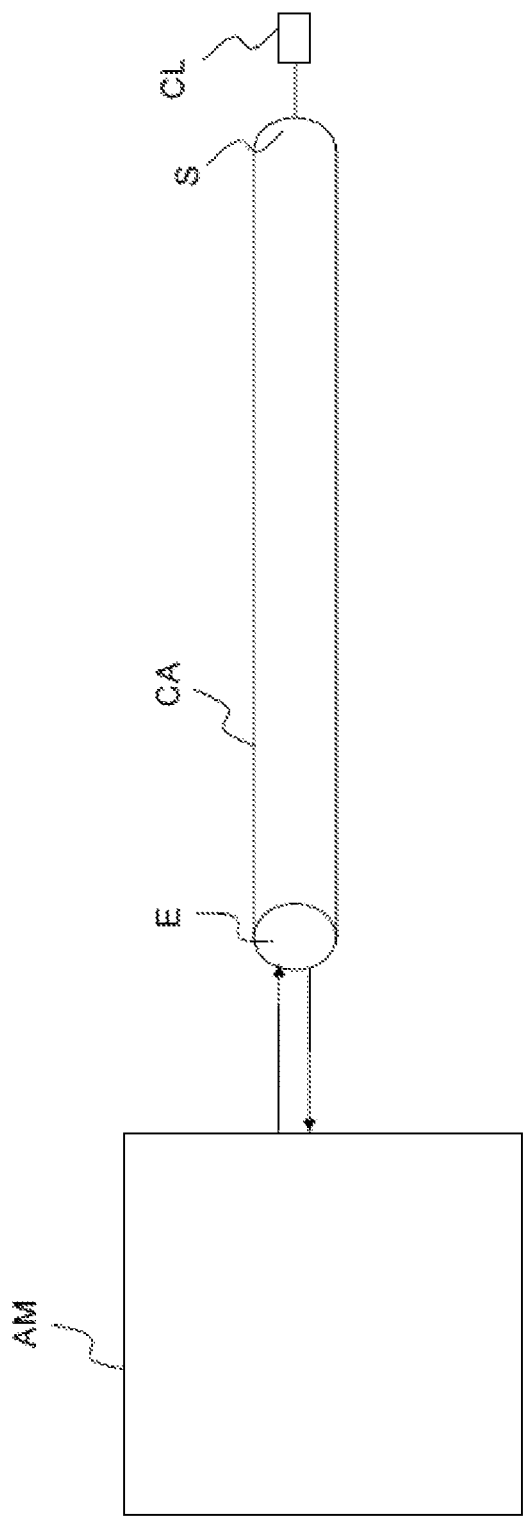
FIG. 1, a basic diagram of a cable to be tested whose lineal parameters it is desired to determine by applying the method according to the invention, FIG. 2, a flowchart describing the steps of the method according to the invention.

The lineal parameters of a transmission line R, L, C and G appear in the well known so-called telegrapher's equations which make it possible to describe the evolution of the voltage and current on an electrical line as a function of distance and time. An electrical line portion can be represented by a four-pole comprising a lineal resistance R, a lineal inductance L, a lineal capacitance C and a lineal conductance G.

The use of this model with distributed constants R, L, C and G possesses numerous advantages when modeling the propagation of a wave over a cable. This model in fact offers a length-independent frequency description, related to four parameters defined by the geometry of the cable as well as its hardware composition. The resistance R and the inductance L are directly related to the metallic conductors of the cable and to their dimensions while the capacitance C and the conductance G describe the nature of the dielectric used to separate these conductors. The parameters R, L, C, G are calculated on the basis of Maxwell's equations.

This modeling makes it possible to characterize a cable by deducing for example the propagation speed as well as the attenuation or else the characteristic impedance of the cable which govern the propagation of any signal in this cable.

However, though a direct relationship exists between these three aforementioned quantities and the four RLCG parameters, it is not necessarily obvious to be able to deduce them from a measurement arising from reflectometry procedures. The blame for this stems from the rather imprecise estimation of the three quantities, namely the phase speed, the attenuation and mainly the characteristic impedance, whose imaginary part is particularly complicated to estimate correctly. The error generated by the usual calculation procedures based on isolating the mismatch spike (in time-domain reflectometry) and studying the amplitude of its Fourier transform, is sufficient to cause a significant disparity in the calculation of the RLCG parameters, particularly in respect of the conductance G which can manifest a disparity of more than 100% with respect to theory.

Moreover, in the field of frequency-domain reflectometry, the existing procedures are very constraining since they make it necessary to have access to each end of the cable. Besides, they suffer from the same lack of precision as time-domain reflectometry procedures.

The invention is based on the principle that the cable studied can be described by the set of the four RLCG parameters, thereby implying that it is quasi-homogeneous over the whole of its length. Moreover, these RLCG parameters comply with certain mathematical properties such as frequency continuity, and physical properties such as the fact that they are necessarily positive. The invention exhibits good results also in the case where the cable is impacted by soft faults which induce a local variation in impedance of the order of a few % with respect to the characteristic impedance of the cable and which are of small dimensions.

The following parameters are defined and used in the subsequent description and with reference to FIG. 1 which gives a basic diagram of a cable under test CA linked at its input E to a measurement apparatus AM suitable for performing a reflectometry measurement with a view to obtaining a measurement of the transfer function of the cable. The opposite, output, end S of the cable is linked to a line-extremity load CL.

$Z_c$ is the characteristic impedance of the cable CA, $\gamma$ is the complex propagation factor of the cable CA, $\alpha$ is the lineal attenuation of the cable CA which is equal to the real part of the complex propagation factor, $\beta$ is the phase factor of the cable CA which is equal to the imaginary part of the complex propagation factor, $Z_G$ is the impedance at the input E of the cable CA, that is to say at the output of the measurement apparatus AM connected at the input E of the cable to carry out a reflectometry measurement, $Z_F$ is the impedance of the load CL at the line extremity, that is to say at the opposite end S of the cable, $$\rho_e = \frac{Z_c - Z_G}{Z_c + Z_G}$$

is the reflection coefficient due to the mismatch between the cable CA and the measurement apparatus AM, stated otherwise the reflection coefficient at the input E of the cable, $$\rho_f = \frac{Z_f - Z_C}{Z_f + Z_C}$$

is the reflection coefficient due to the load CL at the line extremity, that is to say the reflection coefficient at the output S of the cable, l is the length of the cable and H is the frequency transfer function of the cable.

The telegrapher's equations, arising from the distributed-constant modeling of a transmission line, make it possible to link the RLCG parameters of a line to its characteristic impedance $Z_c$ and to the propagation factor $\gamma$ in the so-called forward sense. f is the frequency of the signal propagating along the line.

$$Z_c = \sqrt{(R+i2\pi fL)/(G+i2\pi fC)} \quad (i)$$

$$\gamma = \sqrt{(R+i2\pi fL)*(G+i2\pi fC)} \quad (ii)$$

Equations (i) and (ii) show that it is possible to determine the RLCG parameters by knowing the characteristic impedance and the propagation factor:

$$\begin{cases} R = \text{Re}\{\gamma Z_c\} \\ G = \text{Re}\{\gamma / Z_c\} \\ L = \text{Im}\{\gamma Z_c\}/2\pi f \\ C = \text{Im}\{\gamma / Z_c\}/2\pi f \end{cases} \quad (iii)$$

Re( ) designates the real part function and Im( ) designates the imaginary part function.

Figure 2:
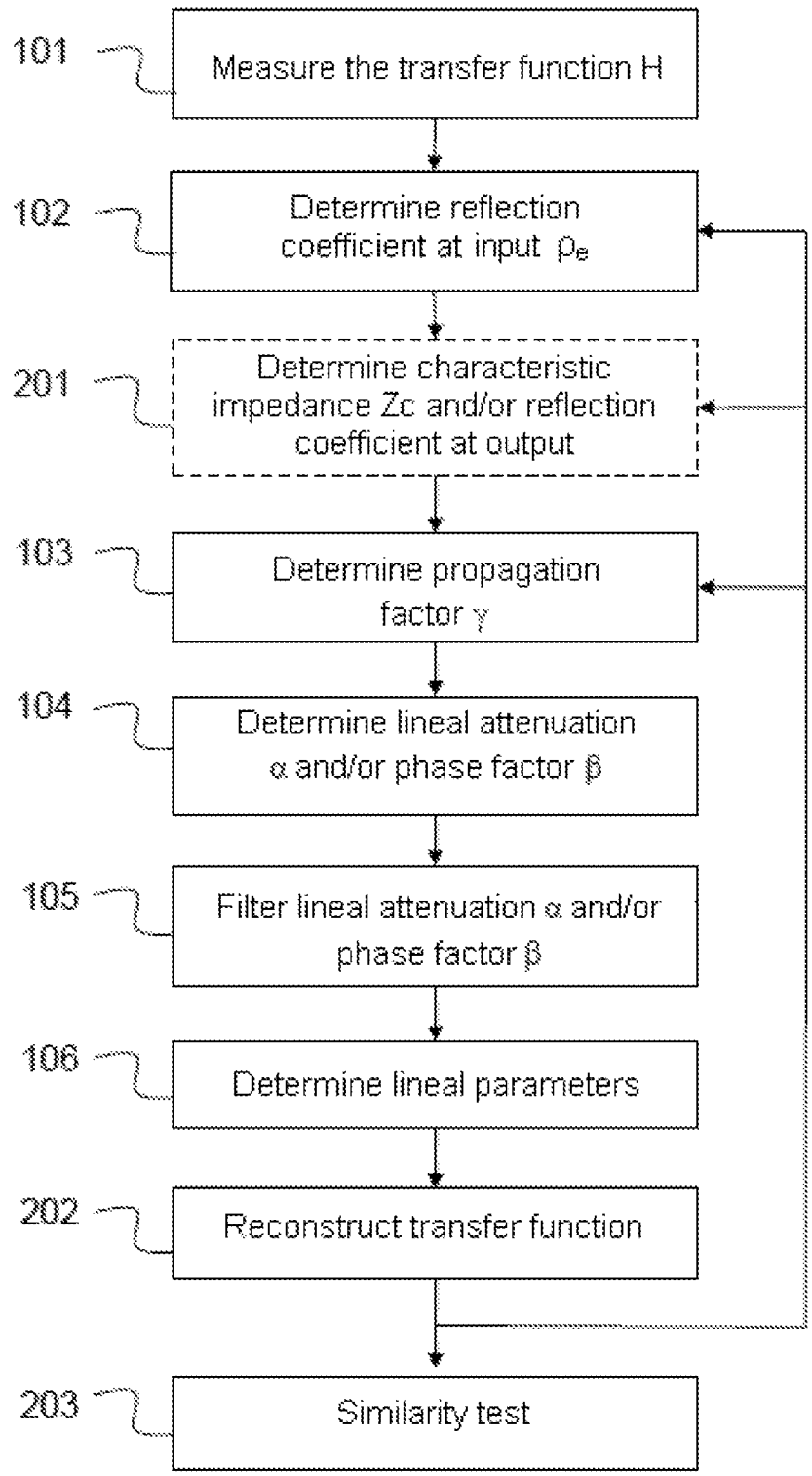

FIG. 2 describes, in a flowchart, the steps for implementing the method according to the invention.

According to a first step 101, a measurement of the frequency transfer function H of the cable to be analyzed is performed. This step is carried out with the aid of a measurement apparatus AM suitable for performing a reflectometry measurement. This measurement consists of the injection of a reflectometry signal at the input E of the cable connected to the measurement apparatus AM and then a measurement of the reflected signal. Numerous reflectometry procedures exist in the state of the art, they are not described here since they do not form the subject of the invention. It is possible however to distinguish, on the one hand, time-domain reflectometry procedures which analyze the signal reflected in the time domain and frequency-domain reflectometry procedures which analyze the signal reflected in the frequency domain.

If a frequency procedure is used, the measurement apparatus AM delivers, directly, a frequency reflectogram which is equal to the frequency transfer function of the cable over the whole frequency range analyzed.

If a time-domain procedure is used, the measurement apparatus AM delivers a time-domain reflectogram to which it is necessary to apply a frequency transform, for example a Fourier transform, and then divide the result by the Fourier transform of the reflectometry signal injected into the cable.

Without departing from the framework of the invention, any other reflectometry procedure or any analysis procedure making it possible to determine, on the basis of measurements made on a cable, the frequency transfer function of this cable enter within the scope of the invention.

In a second step 102 of the method according to the invention, a measurement of the reflection coefficient $\rho_e$ due to the mismatch between the cable and the measurement apparatus AM, stated otherwise the reflection coefficient at the input E of the cable, is determined thereafter.

More precisely, the real part of the reflection coefficient $\rho_e$ is measured. This measurement can be carried out on the basis of the reflectogram measured by the measurement apparatus AM. If a time-domain reflectometry procedure is used, the real part of the reflection coefficient $\rho_e$ is obtained by measuring, at the point of injection E of the reflectometry signal, the amplitude of the mismatch spike in the reflectogram corresponding to the reflected signal.

If a frequency-domain reflectometry procedure is used, then this measurement is obtained by averaging the real part of the frequency transfer function H over the frequency band considered.

It is known that the frequency transfer function is related to the reflection coefficients at the input and at the output of the cable as well as to the propagation factor by the following relation, where l is the length of the cable:

$$H(\omega) = \rho_e + \frac{(1-\rho_e^2)\rho_f e^{-2\gamma l}}{1+\rho_e\rho_f e^{-2\gamma l}} \quad (iv)$$

According to a third step 201, it is possible to determine, on the basis of the measurement of the real part of the reflection coefficient $\rho_e$, a measurement of the real part of the characteristic impedance $Z_c$ and/or a measurement of the real part of the reflection coefficient $\rho_f$ at the line extremity S. These measurements can be obtained with the aid of the relations introduced hereinabove inter-linking these various parameters and on the basis of the knowledge of the impedance $Z_G$ at the output of the measurement apparatus AM and of the impedance $Z_F$ of the load CL at the line extremity.

This third step 201 is optional insofar as the calculation of an estimate of the propagation factor can be made on the basis of just the knowledge of one of the three measurements $\rho_e$, $Z_c$ or $\rho_f$ as is deduced from relation (vi) and knowing that these three quantities are inter-linked by linear relations.

On the basis of relation (iv) it is possible to determine the quantity $H_1$ by deducting the measurement of the real part of the reflection coefficient $\rho_e$ from the measurement H of the transfer function.

$$H_1 = H - \rho_e = r + \frac{(1-\rho_e^2)\rho_f e^{-2\gamma l}}{1 + \rho_e \rho_f e^{-2\gamma l}}$$

where r is the remainder originating from the incomplete estimation of $\rho_e$. (v)

On the basis of relations (iv) and (v) it is possible to determine the propagation factor by virtue of relation (vi):

$$\gamma = \frac{1}{2l}\ln\frac{(1-\rho_e^2)\rho_f - \rho_e \rho_f H_1}{H_1} \quad (vi)$$

On the basis of relation (vi), it is seen that it is possible to estimate 103 a measurement of the propagation factor on the basis of $H_1$, $\rho_e$, and $\rho_f$ and of the knowledge of the length of the cable l. Alternatively, $\rho_f$ can be replaced with its expression as a function of $\rho_e$. It is also possible to bring the characteristic impedance $Z_c$ into the expression (vi).

In an additional step 104, the values of the lineal attenuation α and of the phase factor β are determined thereafter, which are respectively equal to the real part and to the imaginary part of the propagation factor γ.

It is pointed out that all the quantities calculated on the basis of the transfer function H depend on frequency and are thus measured for several values of frequencies in a predefined measurement frequency band.

Without departing from the framework of the invention, other procedures are conceivable for determining, on the basis of at least one measurement carried out on a cable to be tested, an estimate of the propagation factor γ. For example, the aforementioned steps 101, 102, 201, 103 can be replaced with the procedure described in reference [1] which is based on the measurement of a time-domain reflectogram. The procedure described in reference [6] can also be used.

Because of the imperfections related to an imperfect measurement of the reflection coefficient $\rho_e$, in particular because only its real part is measured, the estimates of the parameters α and β are marred by errors which appear in the form of periodic variations or oscillations around the real value.

To combat these variations, it is necessary to undertake a filtering 105 of the parameters α and β.

To carry out this filtering step 105, several solutions are possible.

One solution consists in performing a filtering by linear or nonlinear regression. Accordingly, a model of the variation, as a function of frequency, of the parameters α and β is determined. This model depends on the type of cable envisaged and in particular its physical characteristics.

For a cable of the coaxial cable or bifilar cable or else twisted cable type, a possible model is given by relations (vii) and (viii):

$$\alpha(f) = a_0\sqrt{f} + a_1 f \quad (vii)$$

$$\beta(f) = b_0 f \quad (viii)$$

The real numbers $a_0$, $a_1$ and $b_0$ are the parameters of the regression. A linear model is chosen for the phase factor thereby making it possible to represent the weakly dispersive aspect of the aforementioned cables. A nonlinear model using a polynomial in the square root of the frequency is chosen for the lineal attenuation so as to take account of two main types of losses: metallic losses and dielectric losses.

Generally, the evolution model for the quantities α and β is established on the basis of knowledge of the physical characteristics of the cable to be analyzed.

Without departing from the framework of the invention, the evolution models for the parameters α and β can take the form of any polynomial function of frequency.

On the basis of the measurements obtained on completion of step 104 and of the models given by relations (vii) and (viii), a regression according to the least squares criterion is performed so as to best approximate the parameters of the regression on the basis of the measurements performed in step 104.

Other filtering procedures are conceivable, for example filtering by sliding average or filtering by Fourier transform or any other procedure making it possible to filter the variations of the measurements of the parameters α and β around a target value.

To further improve the precision of the results, according to another variant embodiment of the invention, an additional step of frequency decimation is carried out before the filtering operation performed on the quantities α and β. Stated otherwise, if the measurements of the parameters α and β are carried out for a number N of values of frequencies in a given frequency band $[F_{min}\ F_{max}]$, a subset of these values is selected before applying the filtering operation.

For example, one solution consists in removing at least one measurement point in the low frequencies of the band considered or in the high frequencies or alternatively in the low frequencies and then in the high frequencies.

As is explained further on in the description, the method according to the invention can be executed in an iterative manner. In this case, at each iteration, at least one different measurement point can be removed from the set of measurements available for α and β.

This process makes it possible to eliminate the values of α and β which exhibit overly significant distortions and to ensure convergence to stable values for the parameters of the linear regression.

The method according to the invention can be interrupted after the calculation of the parameters α and β which can be exploited as such for the information that they contain.

If one wishes to determine an estimate of the RLCG lineal parameters, an additional step 106 must be executed.

According to this additional step 106, an estimate of the RLCG lineal parameters is determined on the basis of the filtered measurements of the parameters α and β.

These estimates can be obtained on the basis of equations (iii) and of the parameters of the linear regression given by equations (vii) and (viii).

$$\begin{cases} l = Z_G \dfrac{(1+\rho_e)}{2\pi(1-\rho_e)} b_0 \\ r = \dfrac{4a_0 l\pi}{b_0} \\ c = \dfrac{b_0^3}{\sqrt[4]{4a_1^2 l^2 + b_0^2 l^2}\,\pi^2} \\ g = \dfrac{a_1 b_0^2}{\sqrt{(4a_1^2 + b_0^2)l^2\pi}} \end{cases} \quad \text{(ix)}$$

$$\begin{cases} L = l \\ R = r\sqrt{f} \\ C = c \\ G = gf \end{cases} \quad \text{(x)}$$

Relations (x) also give an evolution model for the RLCG parameters as a function of the frequency which depends on the physical characteristics of the cable. This is why the expressions (x) are valid for cables of the coaxial cable or bifilar cable or twisted cable type.

Relations (x) can take the form of polynomial functions of the frequency of higher order than those described hereinabove in the case of different cables, for example in the case of stranded cables.

According to a particular variant embodiment of the invention, the method can be iterated several times so as to improve the filtering 105 of the errors in the parameters α and β.

Accordingly, in an additional step 202, a reconstruction $H_i$ of the frequency transfer function of the cable is performed on the basis of the RLCG parameters estimated in step 106 by virtue of relations (x).

This reconstruction can be obtained with the aid of a procedure based on a chain matrix such as described for example in one of documents [4] or [5].

A similarity test 203 can be performed to measure the degree of similarity between the reconstructed transfer function $H_i$ on completion of step 202 and the transfer function H measured initially in step 101.

This test can for example be carried out by calculating the coefficient of determination R between the two transfer functions Hi and H or on the basis of a likelihood coefficient V defined by the relation $V^2 = -\log(1-R^2)$.

In a variant embodiment of the invention, steps 202, 203 can be carried out by replacing the frequency transfer function H with any other characteristic parameter X of the propagation in the transmission line. In particular, the transfer function H can be replaced with the propagation factor γ or with the characteristic impedance $Z_c$ or else with a function of one of these parameters. In this case the degree of similarity is determined by comparing the estimate and the measurement of the parameter X in the same manner as that introduced hereinabove for the transfer function H.

At each iteration of the method, the characteristic impedance $Z_c$ is recalculated with the aid of relation (i), on the basis of the parameters R, L, C, G estimated in step 106, and then the reflection coefficient at the input and/or the reflection coefficient at the output are recalculated on the basis of the relations which link them to the characteristic impedance. Steps 103, 104, 105, 106 are thereafter executed on the basis of these new values.

Alternatively, it is also possible to determine a new value of the propagation factor γ directly on the basis of relation (ii) and then to execute steps 104, 105, 106 thereafter to determine new lineal parameters.

At each iteration of the method, the lineal parameters obtained associated with the degree of similarity calculated in step 203 are stored. After a given number of iterations, the parameters corresponding to the highest degree of similarity, that is to say for which the transfer function reconstructed in step 202 is the closest to that measured in step 101, are ultimately preserved.

The iterative manner of operation of the method makes it possible to refine the parameters R, L, C, G estimated in particular because the filtering of the parameters α, β is improved at each iteration.

Alternatively, it is also possible to parametrize the number of iterations of the method as a function of a convergence criterion which can consist in comparing the degree of similarity with a convergence threshold and in stopping the iterations when convergence is obtained, stated otherwise when the degree of similarity is greater than the convergence threshold. This operating variant makes it possible to optimize the number of iterations of the method.

As explained hereinabove, at each iteration, it is also possible to perform a frequency decimation of the measurements of the parameters α, β before filtering.

The applications of the method according to the invention are numerous. The following applications may be cited without being exhaustive or limiting: tracking the aging of a cable based on tracking the evolution of its lineal parameters; defining a database containing these parameters; or improving known reflectometry procedures.

The estimated parameters may evolve if certain external physical parameters, such as temperature, moisture or any other environmental parameter of the cable also evolve. Hence, the application of the method according to the invention can allow the characteristics of a cable to be tracked as a function of the evolution of its physical environment.

The present invention can be implemented on the basis of hardware elements and/or software elements. In particular, the method according to the invention can be available as a computer program product on a computer readable medium. The medium can be electronic, magnetic, optical or electromagnetic.

The reference to a computer program which, when it is executed, performs any one of the functions described above, is not limited to an application program executing on a single host computer. On the contrary, the terms computer program and software are used here in a general sense to refer to any type of computerized code (for example, application software, micro software, a microcode, or any other form of computer instruction) which can be used to program one or more processors to implement aspects of the techniques described here. The computerized means or resources can in particular be distributed ("Cloud computing"), optionally with peer-to-peer technologies. The software code can be executed on any appropriate processor (for example, a microprocessor) or processor core or a set of processors, be they provided in a single calculation device or distributed between several calculation devices (for example such as optionally accessible in the environment of the device). The executable code of each program allowing a programmable device to implement the processes according to the invention, can be stored, for example, in the hard disk or in read-only memory. Generally, the program or programs will be able to be loaded into one of the storage means of the device before being executed. The central unit can control and direct the execution of the instructions or portions of software code of the program or programs according to the invention, which instructions are stored in the hard disk or in the read-only memory or else in the other aforementioned storage elements.

The invention can also be implemented by hardware means or hardware and software means. For example, the invention can be executed by a device coupled to the measurement means AM represented in the diagram of FIG. 1.

Such a device can use one or more dedicated electronic circuits or a general-purpose circuit. The technique of the invention can be carried out on a reprogrammable calculation machine (a processor or a micro controller for example) executing a program comprising a sequence of instructions, or on a dedicated calculation machine (for example a set of logic gates such as an FPGA or an ASIC, or any other hardware module).

According to one embodiment, the device according to the invention comprises at least one computer readable storage medium (RAM, ROM, EEPROM, flash memory or another memory technology, CD-ROM, DVD or another medium based on optical disk, magnetic cassette, magnetic tape, magnetic storage disk or another storage device, or another non-transient computer readable storage medium) coded with a computer program (that is to say several executable instructions) which, when it is executed on a processor or several processors, performs the functions of the above-described embodiments.

By way of exemplary hardware architecture suitable for implementing the invention, a device can comprise a communication bus to which are linked a central processing unit (CPU) or microprocessor, which processor can be "multi-core" or "many-core"; a read-only memory (ROM) able to comprise the programs necessary for the implementation of the invention; a random-access memory (RAM) or cache memory comprising registers suitable for recording variables and parameters created and modified in the course of the execution of the aforementioned programs; and a communication interface or I/O (the acronym standing for "Input/output") suitable for transmitting and receiving data.

In the case where the invention is installed on a reprogrammable calculation machine, the corresponding program (that is to say the sequence of instructions) can be stored in or on a removable storage medium (for example an SD card, a DVD or Bluray, a mass storage means such as a hard disk e.g. an SSD) or non-removable, volatile or non-volatile storage means, this storage medium being readable partially or totally by a computer or a processor. The computer readable medium can be transportable or communicable or mobile or transmissible (i.e. by a 2G, 3G, 4G, Wifi, BLE, optical fiber or other telecommunication network).

REFERENCES

[1] "Analysis of the parameters of a lossy coaxial cable for cable fault location", Shi, Troltzsch, Kanoun
[2] "Inverse Scattering Experiments for Electric Cable Soft Fault Diagnosis and Connector Location", Loete, Zhang, Sorine
[3] "S-Parameter-Based IC Interconnect Transmission Line Characterization", Eisenstadt
[4] "A Mathematical and Lumped-Element Model for Multiple Cascaded Lossy transmission Lines with Arbitrary impedances and discontinuities", Scott Huss
[5] "System simulation of network analysis for a lossy cable system", Qinghai Shi, Olfa Kanoun
[6] "Extraction of high frequency power cable characteristics from S-parameter measurements", R. Papazyan et al.

The invention claimed is:

1. A computer-implemented method for determining at least one lineal parameter of a transmission line, said method comprising the following steps:
    determining at least one measurement of a complex propagation factor γ as a function of frequency from at least one measurement carried out on the transmission line, wherein each of R, L, C, and G is a parameter of the transmission line, wherein the R, L, C, and G parameters are resistance, inductance, capacitance, and conductance, respectively, wherein f denotes the frequency, and wherein the complex propagation factor γ is defined as:

$$\sqrt{(R+12\pi f L)*(G+12\pi f C)},$$

determining at least one measurement of a lineal attenuation α of the transmission line equal to a real part of the measurement of the complex propagation factor γ and/or at least one measurement of phase factor β of the transmission line equal to an imaginary part of the measurement of the complex propagation factor γ, and
    filtering, with a polynomial frequency regression model based on physical characteristics of the transmission line, the measurement of the lineal attenuation α and/or the measurement of the phase factor β.

2. The method for determining at least one lineal parameter of a transmission line of claim 1, in which the regression model for the lineal attenuation is of the type $\alpha(f)=\alpha_0\sqrt{f}+\alpha_1 f$, where $\alpha_0$ and $\alpha_1$ are two real numbers.

3. The method for determining at least one lineal parameter of a transmission line of claim 1, in which the regression model for the phase factor is of the type $\beta(f)=b_0 f$ where $b_0$ is a real number.

4. The method for determining at least one lineal parameter of a transmission line of claim 1, furthermore comprising the determination of an estimate of at least one lineal parameter of the transmission line from among the lineal resistance, the lineal inductance, the lineal capacitance or the lineal conductance, from at least one measurement from among the filtered measurement of the lineal attenuation, the filtered measurement of the phase factor and the measurement of the reflection coefficient $\rho_e$ at a first end of the transmission line, said estimate being determined as a polynomial function of frequency.

5. The method for determining at least one lineal parameter of a transmission line of claim 1, furthermore comprising the following steps:
    determining a new estimate $X_i$ of a characteristic parameter of the propagation in the transmission line from said estimate of at least one lineal parameter of the transmission line,
    measuring the degree of similarity between the new estimate $X_i$ and a measurement X of the same characteristic parameter.

6. The method for determining at least one lineal parameter of a transmission line of claim 5, in which the characteristic parameter of the propagation in the transmission line is the complex propagation factor γ or a function of this parameter.

7. The method for determining at least one lineal parameter of a transmission line of claim 1, in which the measurement of the complex propagation factor γ is determined with the following steps:

determining a measurement H of the frequency transfer function of the transmission line, determining a measurement of the reflection coefficient ρe at a first end of the transmission line, determining a measurement of the complex propagation factor γ from the measurement H of the frequency transfer function, the measurement of the reflection coefficient ρe at a first end of the transmission line and an estimate of the length of the transmission line.

8. The method for determining at least one lineal parameter of a transmission line of claim 7, in which the measurement H of the frequency transfer function of the transmission line is determined with a frequency-domain reflectometry procedure based on injecting, at a first end of the line, a reflectometry signal.

9. The method for determining at least one lineal parameter of a transmission line of claim 8, in which the measurement of the reflection coefficient $\rho_e$ at the input of the transmission line is determined by an average, over a given frequency band, of the measurement H of the frequency transfer function of the transmission line.

10. The method for determining at least one lineal parameter of a transmission line of claim 7, in which the measurement H of the frequency transfer function of the transmission line is determined with the aid of a time-domain reflectometry procedure based on injecting, at a first end of the line, a reflectometry signal.

11. The method for determining at least one lineal parameter of a transmission line of claim 10, in which the measurement of the reflection coefficient $\rho_e$ at the input of the transmission line is determined by measuring the amplitude of the spike of the reflected reflectometry signal at the injection point.

12. The method for determining at least one lineal parameter of a transmission line of claim 7, furthermore comprising the following steps:

determining a measurement of the characteristic impedance $Z_c$ of the transmission line or a measurement of the reflection coefficient at a second end of the transmission line from the measurement of the reflection coefficient $\rho_e$ at a first end of the transmission line, determining a measurement of the complex propagation factor γ from the measurement H of the frequency transfer function and of the measurement of the characteristic impedance $Z_c$ of the transmission line or of the measurement of the reflection coefficient at a second end of the transmission line.

13. The method for determining at least one lineal parameter of a transmission line of claim 5, in which the characteristic parameter of the propagation in the transmission line is the frequency transfer function H or the characteristic impedance $Z_c$ or a function of one of its parameters.

14. The method for determining at least one lineal parameter of a transmission line of claim 5, in which the degree of similarity is measured by calculating a coefficient of determination between the new estimate of a characteristic parameter $X_i$ of the propagation in the transmission line and the measurement X of the same characteristic parameter.

15. The method for determining at least one lineal parameter of a transmission line of claim 4, furthermore comprising the following steps:

determining a new estimate γi of the complex propagation factor of the transmission line from the estimates of the lineal resistance, of the lineal inductance, of the lineal capacitance and of the lineal conductance of the transmission line, executing the steps of the method making it possible to determine an estimate of at least one lineal parameter of the transmission line from the new estimate γi of the complex propagation factor.

16. The method for determining at least one lineal parameter of a transmission line of claim 5, in which the steps of the method are iterated a given number of times and the lineal parameters retained are those determined at the iteration corresponding to the highest degree of similarity.

17. The method for determining at least one lineal parameter of a transmission line of claim 5, in which the steps of the method are iterated as long as the degree of similarity has not attained a given value.

18. The method for determining at least one lineal parameter of a transmission line of claim 1, in which the transmission line is a coaxial cable or a bifilar cable or a twisted cable.

19. The method for determining at least one lineal parameter of a transmission line of claim 1, furthermore comprising a frequency decimation step applied to a plurality of measurements of the lineal attenuation α and/or of measurements of the phase factor β before the filtering step.

20. A computer program comprising instructions stored on a tangible non-transitory storage medium for executing on a processor a method for determining at least one lineal parameter of a transmission line, said method comprising the following steps:

determining at least one measurement of a complex propagation factor γ as a function of frequency from at least one measurement carried out on the transmission line, wherein each of R, L, C, and G is a parameter of the transmission line, wherein the R, L, C, and G parameters are resistance, inductance, capacitance, and conductance, respectively, wherein f denotes the frequency, and wherein the complex propagation factor γ is defined as:

$$\sqrt{(R+12\pi fL)*(G+12\pi fC)},$$

determining at least one measurement of a lineal attenuation α of the transmission line equal to a real part of the measurement of the complex propagation factor γ and/or at least one measurement of a phase factor β of the transmission line equal to an imaginary part of the measurement of the complex propagation factor γ, and filtering, with a polynomial frequency regression model based on physical characteristics of the transmission line, the measurement of the lineal attenuation α and/or the measurement of the phase factor β.

21. A device comprising a measurement apparatus connected to a transmission line and a calculator configured to execute a method for determining at least one lineal parameter of a transmission line, said method comprising the following steps:

determining at least one measurement of a complex propagation factor γ as a function of frequency from at least one measurement carried out on the transmission line, wherein each of R, L, C, and G is a parameter of the transmission line, wherein the R, L, C, and G parameters are resistance, inductance, capacitance, and conductance, respectively, wherein f denotes the frequency, and wherein the complex propagation factor γ is defined as:

$$\sqrt{(R+12\pi fL)*(G+12\pi fC)},$$

determining at least one measurement of a lineal attenuation α of the transmission line equal to a real part of the measurement of the complex propagation factor γ and/or at least one measurement of a phase factor $\beta$ of the transmission line equal to an imaginary part of the measurement of the complex propagation factor $\gamma$, and filtering, with a polynomial frequency regression model based on physical characteristics of the transmission line, the measurement of the lineal attenuation $\alpha$ and/or the measurement of the phase factor $\beta$.

* * * * *